United States Patent [19]

Berger et al.

[11] Patent Number: 4,609,825
[45] Date of Patent: Sep. 2, 1986

[54] DEVICE FOR MODULATING THE SENSITIVITY OF A LINE-TRANSFER PHOTOSENSITIVE DEVICE

[75] Inventors: Jean L. Berger, Grenoble; Louis Brissot, St. Egreve, both of France

[73] Assignee: Thomson-CSF, Paris, France

[21] Appl. No.: 562,463

[22] Filed: Dec. 16, 1983

[30] Foreign Application Priority Data

Dec. 23, 1982 [FR] France ................. 82 21628

[51] Int. Cl.$^4$ ................. H01J 40/14; H04N 3/14
[52] U.S. Cl. ................. 250/578; 358/213
[58] Field of Search ........ 250/211 J, 211 R, 578; 357/24 LR; 358/212, 213

[56] References Cited

U.S. PATENT DOCUMENTS 3,931,463 1/1976 Levine
4,322,753 3/1982 Ishihara ................. 357/24 LR
4,489,423 12/1984 Suzuki ................. 354/24 LR Primary Examiner—David C. Nelms
Assistant Examiner—Michael Messinger
Attorney, Agent, or Firm—Roland Plottel

[57] ABSTRACT

In order to modulate the sensitivity of a photosensitive device by modulating the integration time, a first reading of each line of a photosensitive zone of the device is followed by a second reading at an adjustable time interval. The charges resulting from the first reading operation are removed to the drain while the parasitic charges and the signal charges resulting from the second reading operation are transferred to the read register at the same time. Modulation of the time interval which elapses between two readings of one line is carried out by varying the time which elapses between the injection of one drive pulse into the two registers which control respectively the first reading and the second reading of the lines.

8 Claims, 3 Drawing Figures

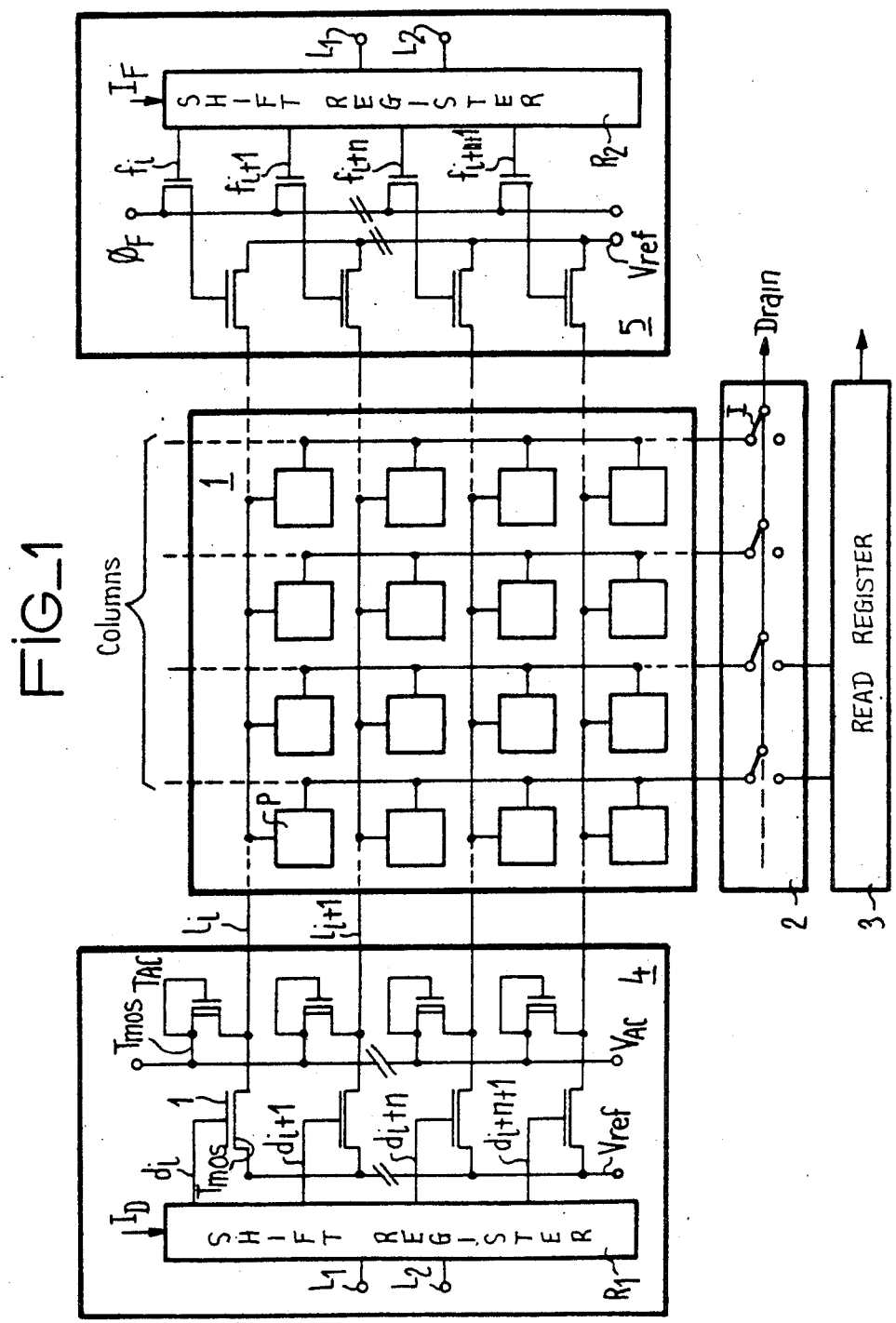

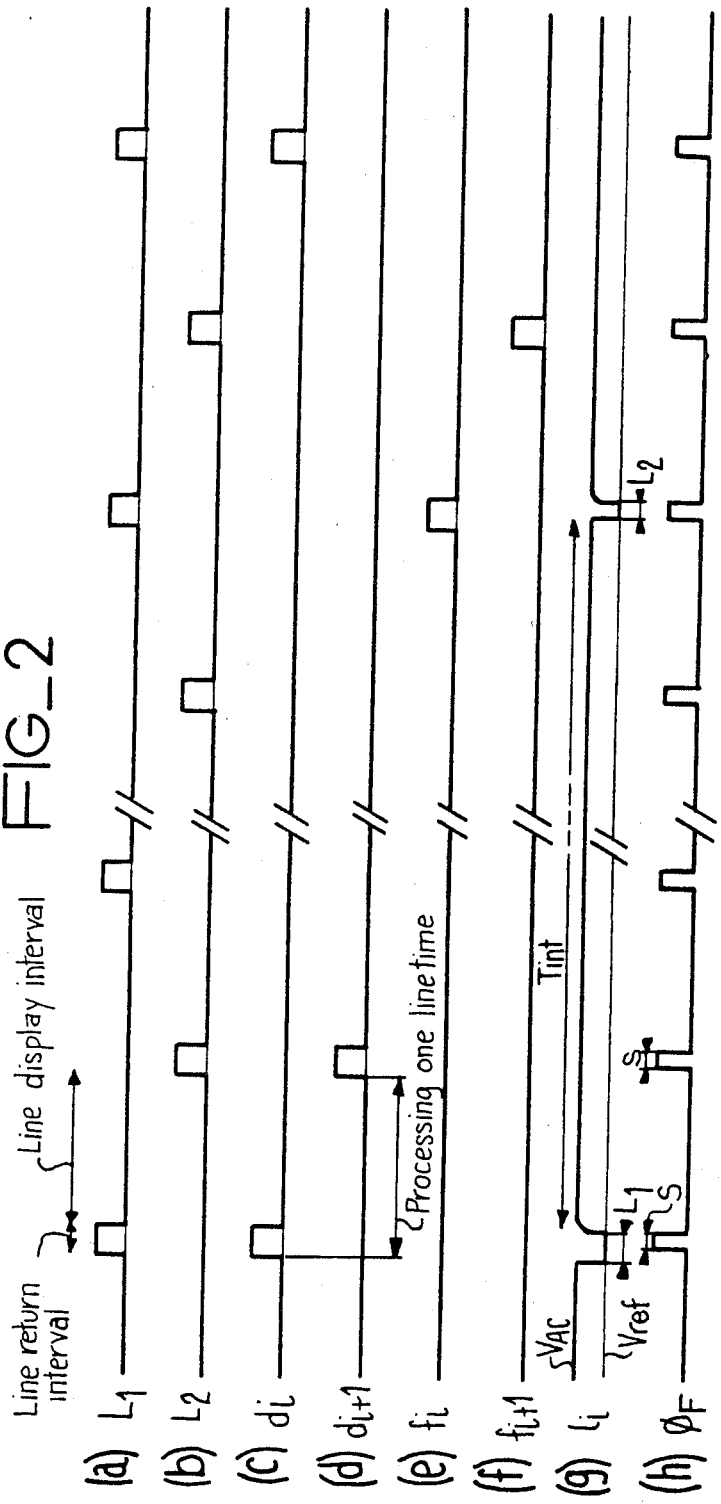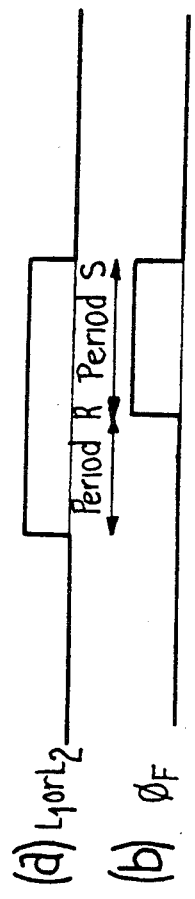

DEVICE FOR MODULATING THE SENSITIVITY OF A LINE-TRANSFER PHOTOSENSITIVE DEVICE

BACKGROUND OF THE INVENTION

1. Field of the Invention

The present invention relates to a device for modulating the sensitivity of a line-transfer photosensitive device.

Photosensitive devices in which scanning is performed by line transfer are already known and have been described in particular in French patent Applications No. 80 09112 and No. 81 07672 filed in the name of Thomson-CSF.

2. Description of the Prior Art

It will be recalled in general terms that a device of this type has a photosensitive zone consisting of M lines each made up of N photosensitive points. The photosensitive points of the different lines are connected in parallel to a memory by means of conductive columns. The signal charges collected on a line of photosensitive points and transferred to the columns are caused by the memory to undergo a periodic transfer from the columns to a read register. In addition, the parasitic charges which are present in tne columns before the signal charges of one of the lines arrive on the columns are periodically transferred by the memory to an evacuation drain.

Known types of line-transfer photosensitive devices have a light sensitivity which is not variable. However, for the different applications of these devices such as cameras available to the general public or in the field of robotics and the like, it is an advantage to have the possibility of using the equivalent of a diaphragm or, in other words, of modulating the sensitivity of the device as a function of the incident light.

It is known to modulate the sensitivity of photosensitive devices in the solid state by varying their integration time.

Up to the present time, however, the basic design concept of line-transfer devices having a light sensitivity which can be varied by modulating the integration time has given rise to problems and the present invention provides the answer to these problems.

SUMMARY OF THE INVENTION

As hereinafter set forth in claim 1, this invention relates to a device for modulating the sensitivity of a line-transfer photosensitive device having a photosensitive zone made up of M lines of N photosensitive points. The photosensitive points of the different lines are connected in parallel by conductive columns to a memory which has the function of transferring to a read register the signal charges of one and the same line and of transferring to an evacuation drain the parasitic charges which are present in the columns prior to arrival of the signal charges. The distinctive feature of the modulating device lies in the fact that it comprises first and second means having the following functions:

the first means carry out a first reading of each line during the time interval which elapses when the charges derived from the columns are removed by the memory to the evacuation drain so that the charges resulting from the first reading operation are consequently removed to the drain at the same time as the parasitic charges;

after an adjustable time interval, the second means carry out a second reading of each line during the time interval which elapses when the charges derived from the columns are transferred by the memory into the read register so that the signal charges resulting from the second reading operation are consequently transferred to the read register.

The device in accordance with the invention offers a number of advantages. Of particular interest is the advantage arising from the availability of electronic modulation of sensitivity as compared with sensitivity modulations involving the use of mechanical control systems which actuate a diaphragm and are very cumbersome.

BRIEF DESCRIPTION OF THE DRAWINGS

Other features of the invention will be more apparent upon consideration of the following description and accompanying drawings, wherein:

FIG. 1 is a schematic diagram showing one embodiment of the device in accordance with the invention;

FIGS. 2a to 2h and FIGS. 3a and 3b are waveform diagrams representing the drive signals employed in the device of FIG. 1.

In the different figures, the same references designate the same elements but the dimensions and proportions of the various elements have not been observed for the sake of enhanced clarity.

DESCRIPTION OF THE PREFERRED EMBODIMENTS

FIG. 1 is a schematic representation of one embodiment of the device in accordance with the invention.

In this figure, there is shown a photosensitive zone 1 constituted by a matrix of M lines each made up of N photosensitive points P. This zone receives the light image to be scanned and converts the image to electric charges known as signal charges $Q_S$. The photosensitive points of a given column are interconnected by one and the same conductive column. The conductive columns terminate in a memory 2. This memory comprises switching means which are represented schematically by switches I and conduct the charges which are present in the conductive columns either to an evacuation drain or to a read register 3. The memory therefore carries out periodic transfer to the read register of the signal charges $Q_S$ which are collected on a line of photosensitive points and transferred to the columns. In addition, the parasitic charges which are present in the columns before the charge signals of one of the lines arrive in the columns and periodically transferred by the memory to an evacuation drain.

In the prior art, the photosensitive points of any one line are connected to each other as well as to an address register which makes it possible to select the matrix line which is to be read. Provision can be made for two address registers, one register being used for addressing the even-numbered lines and the other register being used for addressing the odd-numbered lines.

In the prior art, the integration time of the different lines is constant. The photosensitive points continuously integrate the charges created by the radiation to be scanned except during the few microseconds required in order to permit each line to deliver in turn the charges which it has integrated in the columns.

The invention makes it possible to obtain a modulation of sensitivity of the photosensitive device by varying the integration time of the photosensitive points.

The invention consists in performing in the case of each line a first reading operation and a second reading operation between which an adjustable time interval is allowed to elapse. The charges resulting from the first reading operation are removed to the drain while the parasitic charges and the signal charges resulting from the second reading operation are transferred at the same time to the read register.

The integration time of the different lines is constituted by the time interval which elapses between the first and the second reading operations. A variable integration time is obtained by varying this time interval.

As shown in FIG. 1, the device in accordance with the invention therefore comprises first means 4 whereby the first reading of each line takes place during the time taken by the memory to remove the charges from the columns to the drain. The device further comprises second means 5 whereby, after an adjustable time interval, the second reading of each line takes place during the time taken by the memory to transfer the charges from the columns into the read register.

In the embodiment of the invention shown in FIG. 1, the first and second means aforesaid comprise a shift register having M stages which addresses the M lines of the photosensitive zone by means of transistors.

A drive pulse is applied to the input of each register and transferred periodically from one stage of the register to the next. Modulation of the time interval which elapses between the first and the second reading operation is achieved by varying the elapsed time interval between injection of the drive pulse $I_D$ and injection of the drive pulse $I_F$ into each register $R_1$ and $R_2$.

The shift registers $R_1$ and $R_2$ of the means 4 and 5 are preferably shift registers formed by means of MOS transistors and controlled by two phases $L_1$ and $L_2$.

The device in accordance with the invention will now be described in detail in order to explain the operation of the embodiment shown in FIG. 1, reference being made to FIGS. 2a to 2h and to FIGS. 3a and 3b which represent the control signals of the device. It is postulated in the following description that the photosensitive points are constituted by MOS-phototransistors or by the association of MOS-phototransistors and photodiodes and are formed on a P-type semiconductor substrate.

In this embodiment, the shift registers $R_1$ and $R_2$ are controlled by the same addressing signals $L_1$ and $L_2$ which are represented in FIGS. 2a and 2b.

The signals $L_1$ and $L_2$ are at the high level during one line return interval out of two. It is recalled that photosensitive devices are usually required to be compatible with conventional television standards. In the case of the 625-line standard, an interval of approximately 52 $\mu$s is available for display of a line and an interval of 12 $\mu$s is available for the line return.

The drive pulse $I_D$ and $I_F$ which is applied to the input of each register $R_1$ and $R_2$ is present on one of the outputs of these registers during each line return interval.

FIGS. 2c and 2d and FIGS. 2e and 2f are representations of the signals obtained at the outputs $d_i$ and $d_{i+1}$ of the register $R_1$ and at the outputs $f_i$ and $f_{i+1}$ of the register $R_2$. These outputs address two consecutive lines $l_i$ and $l_{i+1}$ of the photosensitive zone.

The time interval which elapses between passages of the drive pulse from one stage of a register to the next is equal to the time taken for processing one line.

In the embodiment of FIG. 1, the stages of the register $R_1$ of the first means 4 are connected to a series of enhancement-mode MOS transistors designated by the reference TMOS-1. These transistors TMOS are connected on the one hand to one of the lines of the photosensitive zone and on the other hand to a bias voltage. When this bias voltage is applied to the gates of the MOS-phototransistors, it permits transfer of the charges stored by these points to the columns, that is to say the reading of one line. In FIG. 1, this voltage is the reference voltage Vref of the device. The gate of the transistors TMOS-1 is connected to one stage of the shift register $R_1$. The arrival of the drive pulse $I_D$ on a stage initiates conduction of the transistor TMOS-1 which is associated with this stage and initiates reading of the corresponding line of the photosensitive zone which receives the bias voltage Vref.

The first means 4 of FIG. 1 comprise another series of depletion-mode MOS transistors designated by the reference TMOS-TAC. These transistors are mounted as emitter-followers between one line of the photosensitive zone and a bias voltage $V_{AC}$ which permits integration of the charges when this voltage is applied to the MOS-phototransistors.

The departure of the drive pulse $I_D$ from a stage has the effect of cutting-off the transistor TMOS-1 which is associated with this stage. At this instant, the corresponding transistor TMOS-TAC applies the voltage $V_{AC}$ to the line which is addressed by said stage, thus bringing to an end the reading of charges of said line and marking the start of its integration period.

FIG. 2g represents the bias voltage received by the line $l_i$ of the photosensitive zone. This voltage undergoes a transition from $V_{AC}$ to Vref during the line return interval in which the drive pulse $I_D$ is present on the output $d_i$ of the register $R_1$.

It has been seen earlier that, in line-transfer photosensitive devices, there is a periodic recurrence of the two following sequences:

a first sequence corresponding to transfer to memory of the parasitic charges which are present in the columns, prior to arrival of the signal charges in the columns;

a second sequence corresponding to transfer to memory of the signal charges of one line which are present in the columns.

In the embodiment of FIG. 1, these two sequences take place during the line return interval. The line return interval is composed of two periods as shown in FIG. 3a, namely a period R during which the first sequence takes place followed by a period S during which the second sequence takes place.

The reading operation which is carried out on line $l_i$ (as shown in FIG. 2g) whilst the drive pulse is present on the output $d_i$ begins with the start of the line return interval during a period R. The charges transferred from line $l_i$ to the columns are therefore removed to the memory and then to the drain. The end of the line return interval marks the end of the first reading $L_1$ of the line $l_i$ and the beginning of the integration period Tint of this line.

The outputs of the register $R_2$ of the means 5 are connected to the gates of MOS transistors designated by the reference TMOS-F. The transistors TMOS-F are connected on the one hand to a clock signal $\phi_F$ shown in FIGS. 2h and 3b which changes to the high level during the period S of the line return interval and on the other hand to the gates of another series of MOS transistors designated by the reference TMOS-2.

A transistor TMOS-F is triggered into conduction when the drive pulse $I_F$ arrives on the stage of the register to which said transistor is connected but remains in the conducting state only during the period S of the line return interval under the action of the signal $\phi_F$.

Each transistor TMOS-F drives the gate of a transistor TMOS-2 which is connected to a line of the photosensitive zone and to the bias voltage Vref which permits reading of the points of one line.

A transistor TMOS-F in the conducting state applies the bias voltage Vref to the corresponding line of the photosensitive zone via the transistor TMOS-2 and therefore initiates reading of said line.

In FIG. 2g, it is apparent that the second reading $L_2$ of the line $l_i$ takes place during the period S of the line return interval while the pulse $I_F$ is present on the output $f_i$. The beginning of this second reading operation marks the end of the integration period of the line $l_i$.

The second reading $L_2$ of the line $l_i$ takes place during the period S of the line return interval, with the result that the charges transferred from the line $l_i$ to the columns are sent to the read register 3 via the memory.

The integration time of the lines of the photosensitive zone is therefore varied by modulating the time interval which elapses between the arrival of a drive pulse on the outputs $d_i$ and $f_i$ of the two registers which address the same line $l_i$ of the photosensitive zone.

During each line return interval, there is therefore carried out in the method according to the invention first of all the first reading $L_1$ of a line $l_{i+n}$ for example, during the period R, and then the second reading $L_2$ of a line $l_i$ for example, during the period S.

The invention makes it possible to vary the integration time to a considerable extent. The readings $L_1$ and $L_2$ of a line $l_i$ can be performed during two consecutive line return intervals. In this case the integration period is 64 µs in the 625-line standard. The integration period can vary up to about $(M-1).64$ µs, where M is the number of lines of the photosensitive zone.

The embodiment of FIG. 1 can readily be adapted to line-transfer devices in which the two sequences of removal of the parasitic charges and of reading of the signal charges do not take place during the line return interval. It is only necessary to modify thd drive signals.

The method in accordance with the invention is applicable in the same manner when the photosensitive points consist of photodiodes. The only difference in the case of photodiodes is that the voltages Vref and $V_{AC}$ are not applied to the MOS-phototransistors but to gates which control the transfer between the photodiodes and the columns and which are not exposed to the radiation. When the photodiodes are fabricated on a P-type substrate, the voltage Vref which is applied to the gates and initiates reading of the photodiodes is higher than the voltage $V_{AC}$ which is applied to the gates and permits integration of the charges.

It will clearly be understood that the invention is readily applicable to photosensitive points formed on an N-type substrate.

What is claimed is:

1. A device for modulating the sensitivity of a line-transfer photosensitive device having a photosensitive zone constituted by M lines of N photosensitive points, the photosensitive points of the different lines being connected in parallel by conductive columns to a memory which has the function of transferring signal charges coming from a line of photosensitive points to a read register and of transferring to an evacuation drain parasitic charges which are present in the columns prior to arrival of the signal charges, wherein said device comprises first and second means having the following functions:

the first means carry out a first reading operation of each line when the parasitic charges derived from the columns are transferred from the memory to the evacuation drain so that charges resulting from the first reading operation are consequently removed to the drain at the same time as said parasitic charges;

after an adjustable time interval, the second means carry out a second reading operation of each line when signal charges derived from the columns are transferred from the memory into the read register so that said signal charges resulting from the second reading operation are consequently transferred to the read register and wherein the first and the second means comprise a first and a second shift registers, with M stages, said shift registers being controlled by the same addressing signals, in which said M stages address the M lines of the photosensitive zone via transistors, a drive pulse being applied to the input of each register and said drive pulse being transferred periodically from one stage to the next and wherein modulation of the time interval which elapsed between the first and the second reading of the same line is obtained by varying the time interval which elapses between injection of said drive pulse into each register.

2. A device according to claim 1 wherein the first means comprise two series of M transistors of the MOS type; each MOS transistor having a drain, a source and a gate;

the transistors of one of the series are enhancement-mode MOS transistors connected by their drain and their source to one line of the photosensitive zone and to a bias voltage which permits transfer of charges from the photosensitive points to the columns, the gates of said transistors being connected to one stage of the shift register, the arrival of a pulse in a stage providing reading of the line addressed by said stage;

the transistors of the other series are depletion-mode MOS transistors mounted as emitter-followers, said transistors being connected by their drain and their source to one line of the photosensitive zone and to a bias voltage which permits integration of the charges in the photosensitive points, the departure of a pulse from one stage initiating the integration period of the line which is addressed by said stage.

3. A device according to claim 1 wherein the second means aforesaid comprise a first and a second series of M enhancement-mode MOS transistors, each MOS transistor having a drain, a source and a gate:

the transistors of a first series are connected by their drain and their source to one line of the photosensitive zone and to a bias voltage which permits transfer of the charges of the photosensitive points to the columns, the gates of said transistors being connected to a transistor of the other series;

the transistors of a second series are connected by their drain and their source to a clock signal which indicates the time interval during which the charges derived from the columns are transferred into the read register by the memory and to the gates of transistors of the first series, the gates of said transistors of the second series being each connected to one stage of the shift register of the second means, each transistor of the second series which is connected to one stage being triggered into conduction by the arrival of a pulse on its stage when the charges derived from the columns are transferred, from the memory into the read register the conduction of said transistor initiating conduction of the corresponding transistor of the first series and therefore reading of one line of the photosensitive zone.

4. A device according to claim 2, wherein the second means comprise a first and a second series of M enhancement-mode MOS transistors, each MOS transistor having a drain, a source and a gate:

the transistors of a first series are connected by their drains and their sources to one line of the photosensitive zone and to a bias voltage which permits transfer of charges from the photosensitive points to the columns, the gates of said transistors being connected to one transistor of the other series;

the transistors of a second series are connected by their drain and their source to a clock signal which indicates the time interval during which the charges derived from the columns are transferred into the read register by the memory and to the gates of transistors of the first series, the gates of said transistors of the second series being connected to one stage of the shift register of the second means, the transistor of the second series which is connected to a given stage being triggered into conduction by the arrival of a pulse on the stage aforesaid when the charges derived from the columns are transferred from the memory into the read register the conduction of said transistor initiating conduction of the corresponding transistor of the first series and therefore reading of one line of the photosensitive zone.

5. A device according to claim 1, wherein the shift registers aforesaid are constituted by MOS transistors.

6. A device according to claim 2, wherein the shift registers aforesaid are constituted by MOS transistors.

7. A device according to claim 3, wherein the shift registers aforesaid are constituted by MOS transistors.

8. A device according to claim 4, wherein the shift registers aforesaid are constituted by MOS transistors.

* * * * *